US011264965B2

United States Patent
Aizawa et al.

(10) Patent No.: US 11,264,965 B2
(45) Date of Patent: Mar. 1, 2022

(54) NOISE FILTER

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Takeshi Aizawa, Mie (JP); Asato Hibino, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/053,489

(22) PCT Filed: Apr. 25, 2019

(86) PCT No.: PCT/JP2019/017567
§ 371 (c)(1),
(2) Date: Nov. 6, 2020

(87) PCT Pub. No.: WO2019/220911
PCT Pub. Date: Nov. 21, 2019

(65) Prior Publication Data
US 2021/0143786 A1    May 13, 2021

(30) Foreign Application Priority Data
May 16, 2018 (JP) .............................. JP2018-094475

(51) Int. Cl.
*H03H 7/01* (2006.01)
*H03H 1/00* (2006.01)

(52) U.S. Cl.
CPC ............ *H03H 7/0115* (2013.01); *H03H 1/00* (2013.01); *H03H 1/0007* (2013.01); *H03H 2001/0035* (2013.01)

(58) Field of Classification Search
CPC .......................... H03H 1/0007; H03H 7/0115
(Continued)

(56) References Cited

U.S. PATENT DOCUMENTS

2015/0008989 A1* 1/2015 Aizawa ................ H03H 7/0115
333/185

FOREIGN PATENT DOCUMENTS

| JP | S60-144316 U | 9/1985 |
| JP | H06-013120 U | 2/1994 |

(Continued)

OTHER PUBLICATIONS

International Search Report dated Jul. 2, 2019 for WO 2019/220911 A1 (4 pages).

*Primary Examiner* — Rakesh B Patel
(74) *Attorney, Agent, or Firm* — Abelman, Frayne & Schwab

(57) ABSTRACT

Provided is a noise filter that can enhance noise removal performance with a simple configuration. A noise filter (10) includes a connector (20) that houses a terminal fitting (22) connected to an input/output wire (WH) in a state in which the input/output wire (WH) is lead out from the connector (20). The noise filter (10) includes a coil (40) that is connected to the input/output wire (WH), a capacitor (30) that is electrically connected to the coil (40), and a magnetic member (50). The noise filter (10) includes a case (60) that houses the capacitor (30), the coil (40), and the magnetic member (50), and a holding member (70) that holds the magnetic member (50) in a state in which the magnetic member (50) is positioned with respect to the coil (40).

7 Claims, 4 Drawing Sheets

(58) Field of Classification Search
USPC .................................................. 333/181, 185
See application file for complete search history.

(56) References Cited

FOREIGN PATENT DOCUMENTS

| | | |
|---|---|---|
| JP | 2006-041803 A | 2/2006 |
| JP | 2007-335277 A | 12/2007 |
| JP | 2016-063331 A | 4/2016 |
| JP | 2016-208487 A | 12/2016 |
| WO | 2017-170817 A1 | 10/2017 |

* cited by examiner

NOISE FILTER

CROSS REFERENCE TO RELATED APPLICATIONS

This application is a national phase of PCT application No. PCT/JP2019/017567, filed on 25 Apr. 2019, which claims priority from Japanese patent application No. 2018-094475, filed on 16 May 2018, all of which are incorporated herein by reference.

TECHNICAL FIELD

The present invention relates to a noise filter.

BACKGROUND

A noise filter described in Patent Document 1 is configured to be interposed between two conduction paths. This noise filter includes a housing, a grounding conductor, a first conductor, and a second conductor. The housing houses the grounding conductor, the first conductor, and the second conductor. The grounding conductor includes a contact portion for electrical contact with a conductive member such as a vehicle body. The first conductor is connected to a conduction path that is lead into the housing via an insertion hole formed in a surface of the housing. The second conductor is connected to a conduction path that is lead into the housing via another insertion hole formed in the surface of the housing. The grounding conductor is connected to the first conductor and the second conductor via a capacitor. Also, the first conductor is connected to the second conductor via an inductor layer that is arranged on the outside of the housing. The inductor layer includes an axial core and a coil wound around the axial core.

PRIOR ART DOCUMENT

Patent Document

Patent Document 1: JP 2016-208487A

SUMMARY OF THE INVENTION

Problems to be Solved

In the noise filter described in Patent Document 1, the inductor layer is arranged on the outside of the housing, and therefore a magnetic flux generated from the coil is likely to leak to the outside. Therefore, the noise filter has a risk in that the inductance of the coil may be reduced and noise removal performance may be deteriorated. In order to increase the inductance of the coil in the noise filter configured as described above, it is possible to consider covering the inductor layer with a magnetic body. However, in this configuration, it is necessary to newly add a member on the outside of the housing and the structure of the noise filter becomes complex.

The present invention was completed based on the above circumstances, and a problem to be solved by the present invention is to provide a noise filter that can enhance noise removal performance with a simple configuration.

Means to Solve the Problem

A noise filter according to the present invention includes:
a connector that houses a terminal fitting connected to a conducting wire in a state in which the conducting wire is lead out from the connector;
a coil that is connected to the conducting wire;
a capacitor that is electrically connected to the coil;
a magnetic member;
a case that houses the capacitor, the coil, and the magnetic member; and
a holding member that holds the magnetic member in a state in which the magnetic member is positioned with respect to the coil.

Effect of the Invention

In the noise filter, the coil and the capacitor are connected to the conducting wire connected to the terminal fitting. Therefore, noise generated in the conducting wire can be removed by the coil and the capacitor in the noise filter. Furthermore, in the noise filter, the magnetic member is positioned with respect to the coil by the holding member in the case in which the coil is housed. Therefore, a magnetic flux generated from the coil can be kept from leaking, and a reduction in the inductance can be suppressed. Thus, the noise removal performance of the coil can be enhanced in the noise filter with a simple configuration in which the magnetic member is held by the holding member.

DETAILED DESCRIPTION TO EXECUTE THE INVENTION

Figure 1:
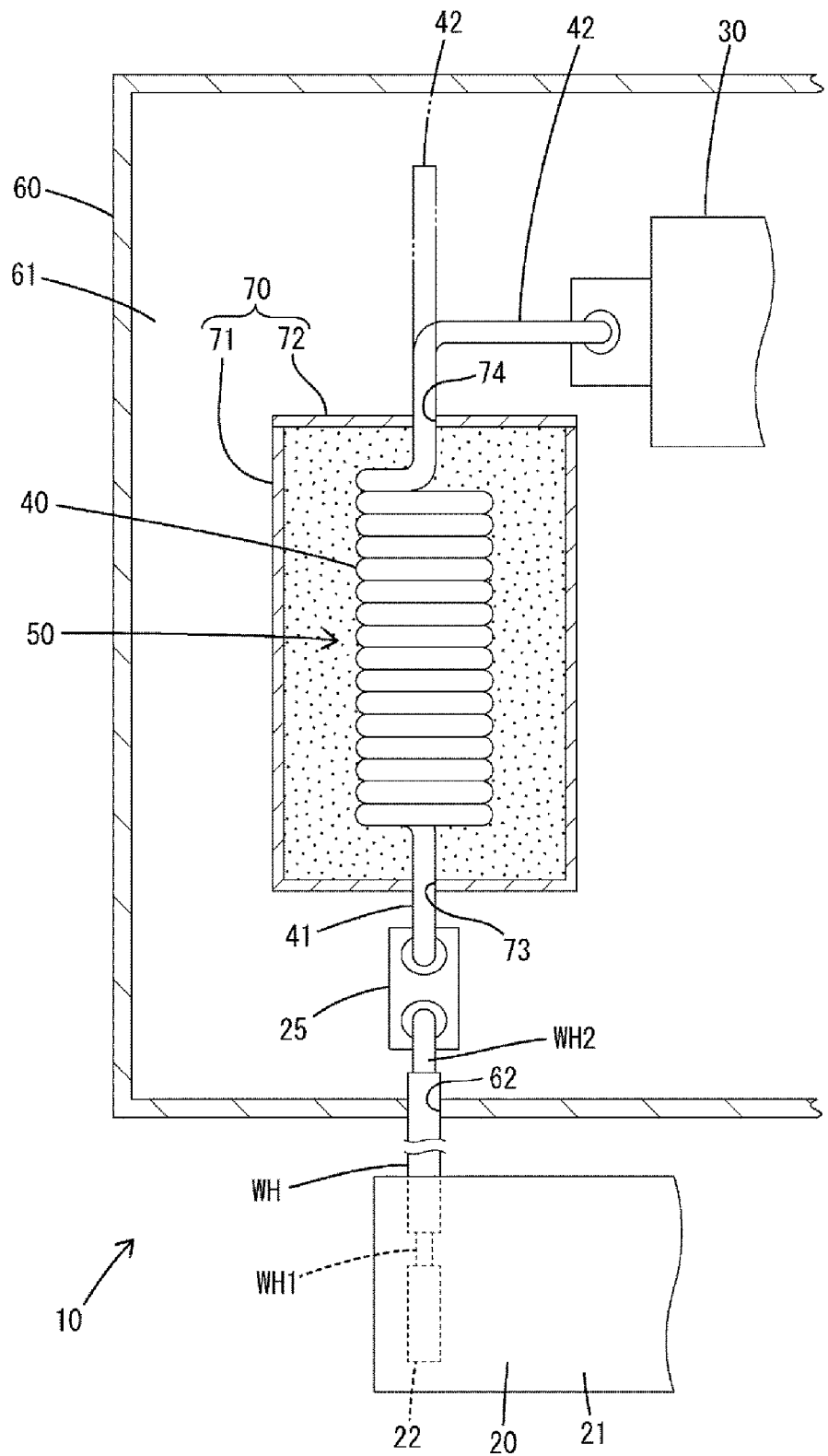
FIG. 1 is a plan view showing a portion of a noise filter according to Embodiment 1.

The present invention may also have a configuration in which the holding member has a container-like shape and is arranged inside the coil, and the magnetic member is housed in the holding member.

According to this configuration, the inductance can be enhanced in the noise filter as a result of the magnetic member being arranged inside the coil.

The present invention may also have a configuration in which the holding member is made of an insulating material.

According to this configuration, the magnetic member is housed in the holding member made of an insulating material. Therefore, it is possible to prevent electrolytic corrosion that would be caused if the magnetic member and the coil are in direct contact with each other.

The present invention may also have a configuration in which the holding member is made of a magnetic material, and the magnetic member is held by the holding member so as to surround the coil and form a closed magnetic circuit around the coil.

According to this configuration, a closed magnetic circuit is formed around the coil by the magnetic member surrounding the coil. Therefore, a magnetic flux generated from the coil can be kept from leaking and the inductance of the coil can be enhanced in the noise filter.

The present invention may also have a configuration in which a plurality of the magnetic members are arranged around the coil so as to surround the coil and be spaced apart from each other.

According to this configuration, the plurality of magnetic members are arranged so as to surround the coil, and therefore a magnetic flux generated from the coil is likely to be kept from leaking and the inductance of the coil is likely to be enhanced in the noise filter. Furthermore, since the plurality of magnetic members are arranged around the coil so as to be spaced apart from each other, the weight and the cost of the noise filter can be reduced when compared to a configuration in which the magnetic members are arranged around the entire periphery of the coil.

The present invention may also have a configuration in which the holding member is fixed to an inner surface of the case.

According to this configuration, the magnetic member can be arranged along the inner surface of the case.

The present invention may also have a configuration in which the magnetic member has a thin plate-like shape, the holding member faces the inner surface of the case with a space therebetween, and the magnetic member is held in a state of being sandwiched between the holding member and the inner surface of the case as a result of being inserted into the space.

According to this configuration, the magnetic member can be easily attached to the case in a state of being positioned, as a result of being inserted into the space between the holding member and the case. Since the inner surface of the case is used as a means for positioning the magnetic member, the shape of the holding member can be simplified when compared to a case in which the magnetic member is positioned by using only the holding member.

The present invention may also have a configuration in which the noise filter further includes an earth member that is electrically connected to the capacitor and is used for grounding, the earth member includes a flat plate-shaped earth plate portion that supports the coil and the capacitor, an attachment portion that extends from the earth plate portion and is attached to a grounding member to be grounded, and a pressure receiving portion that stands on the earth plate portion and receives a pressing force from a side opposite to the coil and the capacitor, and the earth member is attached to the case as a result of a pressing force being applied to the pressure receiving portion.

According to this configuration, the coil, the capacitor, and the earth member can be attached to the case through a single action of pressing the pressure receiving portion, and therefore workability is good. Furthermore, there is no need to touch the coil and the capacitor when attaching the coil and the capacitor to the case, and accordingly, there is no risk that the coil and the capacitor will be damaged.

Embodiment 1

The following describes Embodiment 1, which is a specific embodiment of a noise filter according to the present invention, with reference to FIG. 1. Note that in the following description, with regard to the front-rear direction, the lower side of FIG. 1 is defined as the front side and the upper side of FIG. 1 is defined as the rear side. With regard to the left-right direction, the left side and the right side are defined based on the left-right direction shown in FIG. 1. With regard to the up-down direction, the front side of FIG. 1 is defined as the upper side and the rear side of FIG. 1 is defined as the lower side.

As shown in FIG. 1, a noise filter 10 according to the present embodiment includes a connector 20, a capacitor 30, a coil 40, a magnetic member 50, a case 60, and a holding member 70. The case 60 houses the capacitor 30, the coil 40, the magnetic member 50, and the holding member 70. Note that FIG. 1 shows the coil 40, the magnetic member 50, and the holding member 70 that are provided on the left side, but a coil 40, a magnetic member 50, and a holding member 70 that have the same configurations as corresponding members are also provided on the right side in the case 60. The case 60 is made of a synthetic resin, for example. The case 60 includes a lower housing 61 and an upper housing (not shown). The lower housing 61 has a box-like shape and the upper side of the lower housing 61 is open, for example. The upper housing has a box-like shape and can close the upper side opening of the lower housing 61. A pair of insertion holes 62 (only one of which is shown in FIG. 1) through which an input/output wire WH, which will be described later, can pass are formed in the case 60.

The connector 20 is connected to a harness side conduction path (not shown) that constitutes the input/output wire WH. As shown in FIG. 1, the connector 20 includes a housing 21 and a terminal fitting 22. One end WH1 of the input/output wire WH (corresponding to a "conducting wire" in the present invention) is connected to the terminal fitting 22. Another end WH2 of the input/output wire WH is connected to a conductive plate 25 with solder. The housing 21 has a box-like shape and an insertion hole (not shown) through which the input/output wire WH passes is formed in the housing 21. The housing 21 houses the terminal fitting 22 in a state in which the other end WH2 side portion of the input/output wire WH is lead out from the housing 21. Note that FIG. 1 only shows the terminal fitting 22 that is provided on the left side in the connector 20, but a terminal fitting 22 having a similar configuration is also housed on the right side in the housing 21.

As shown in FIG. 1, the coil 40 is formed by winding an uncoated metal wire. The coil 40 is drawn out at a predetermined height such that one end 41 and another end 42 of the coil are directed to mutually opposite directions. The one end 41 of the coil 40 is connected to the conductive plate 25 with solder. The other end 42 of the coil 40 is connected to an electrode on one side of the capacitor 30 with solder.

The magnetic member 50 is a powder of a magnetic material such as iron. For example, the magnetic member 50 may be ferrite powder or iron powder. The magnetic member 50 is held by the holding member 70 so as to surround the coil 40 and form a closed magnetic circuit around the coil 40.

As shown in FIG. 1, the holding member 70 has a box-like external shape that is substantially rectangular parallelepiped. The holding member 70 is constituted by a magnetic material. The holding member 70 includes a front box portion 71 and a rear wall portion 72. The front box portion 71 has a box-like shape and the rear side of the front box portion 71 is open. The rear wall portion 72 is attached to the front box portion 71 to close the opening of the front box portion 71. The holding member 70 is fixed to a bottom surface of the case 60. Insertion holes 73 and 74 are respectively formed at centers of a pair of wall portions of the holding member 70 facing each other in the front-rear direction. The coil 40 and the magnetic member 50 are arranged inside the holding member 70. The one end 41 of the coil 40 passes through the insertion hole 73. The other end 42 of the coil 40 passes through the insertion hole 74. The insertion holes 73 and 74 include functions as means for positioning the coil 40 with respect to the holding member 70. The coil 40 is located at the center of the holding member 70 in the left-right direction and the up-down direction. The magnetic member 50 is contained between the coil 40 and the holding member 70. Specifically, the magnetic member 50 is contained inside the coil 40 and between the outer periphery of the coil 40 and the holding member 70. Thus, the holding member 70 holds the magnetic member 50 in a state in which the magnetic member 50 is positioned with respect to the coil 40. The coil 40 and the magnetic member 50 are positioned via the holding member 70.

The capacitor 30 may be a film capacitor, for example. As shown in FIG. 1, the capacitor 30 is electrically connected to the coil 40. Specifically, a left side electrode of the capacitor 30 is connected to the other end 42 of the coil 40. Note that FIG. 1 only shows the left side coil 40, but another end of the right side coil (not shown) is connected to a right side electrode of the capacitor 30.

As a result of the connector 20 being connected to the harness side conduction path (not shown), the noise filter 10 configured as described above can remove noise generated in the harness side conduction path, by using the coil 40 and the capacitor 30. Furthermore, the coil 40 is surrounded by the magnetic member 50 inside the holding member 70 constituted by a magnetic material. Therefore, a magnetic flux generated from the coil 40 is kept from leaking and the inductance of the coil 40 is enhanced in the noise filter 10. As described above, as a result of the magnetic member 50 being contained in the holding member 70 in which the coil 40 is housed, the noise removal performance can be enhanced in the noise filter 10 with a simple configuration without changing the external shape of the case 60 or the like.

Next, a process for attaching the coil 40 to the holding member 70 will be described.

First, as shown in FIG. 1, the capacitor 30 and the holding member 70 are attached to the bottom surface of the case 60. The holding member 70 is prepared in a state in which the opening of the front box portion 71 is not closed by the rear wall portion 72. Then, the coil 40 is placed into the front box portion 71 from the one end 41 side via the opening. At this time, the one end 41 of the coil 40 is passed through the insertion hole 73 and is soldered to the conductive plate 25. Thereafter, the inside of the holding member 70 is filled with the magnetic member 50. The magnetic member 50 is contained between the coil 40 and the holding member 70. Specifically, the magnetic member 50 is contained inside the coil 40 and between the outer periphery of the coil 40 and the holding member 70. Subsequently, the opening of the front box portion 71 is closed by the rear wall portion 72 while passing the other end 42 of the coil 40 through the insertion hole 74 in the rear wall portion 72. At this time, the other end 42 of the coil 40 extends rearward as indicated by an imaginary line (line-double-dash line) in FIG. 1. Therefore, the other end 42 of the coil 40 is bent to be overlaid on the left side electrode of the capacitor 30 as indicated by a solid line in FIG. 1. Then, the other end 42 of the coil 40 is connected to the left side electrode of the capacitor 30 with solder. Note that the right side coil (not shown) is attached to the holding member 70 through a similar process.

As described above, in the noise filter 10 according to Embodiment 1, the coil 40 and the capacitor 30 are connected to the input/output wire WH that is connected to the terminal fitting 22. Therefore, noise generated in the input/output wire WH can be removed by the coil 40 and the capacitor 30 in the noise filter 10. Furthermore, in the noise filter 10, the magnetic member 50 is positioned with respect to the coil 40 by the holding member 70 inside the case 60 in which the coil 40 is housed. Therefore, a magnetic flux generated from the coil 40 can be kept from leaking and a reduction in the inductance can be suppressed. As described above, the noise removal performance of the coil 40 can be enhanced in the noise filter 10 with a simple configuration in which the magnetic member 50 is held by the holding member 70.

Also, the holding member 70 of the noise filter 10 is made of a magnetic material. The magnetic member 50 is held by the holding member 70 so as to surround the coil 40 and form a closed magnetic circuit around the coil 40.

Thus, a closed magnetic circuit is formed around the coil 40 by the magnetic member 50 surrounding the coil 40. Therefore, the noise filter 10 can keep a magnetic flux generated from the coil 40 from leaking and enhance the inductance of the coil 40.

Embodiment 2

Next, Embodiment 2, which is a specific embodiment of the present invention, will be described with reference to FIG. 2. The noise filter 10 according to Embodiment 2 differs from the above-described Embodiment 1 in the configuration of the holding member. Other configurations are the same as those in the above-described Embodiment 1, and therefore the same configurations are denoted with the same reference numerals as those used in Embodiment 1, and descriptions of structures, functions, and effects thereof are omitted.

Figure 2:
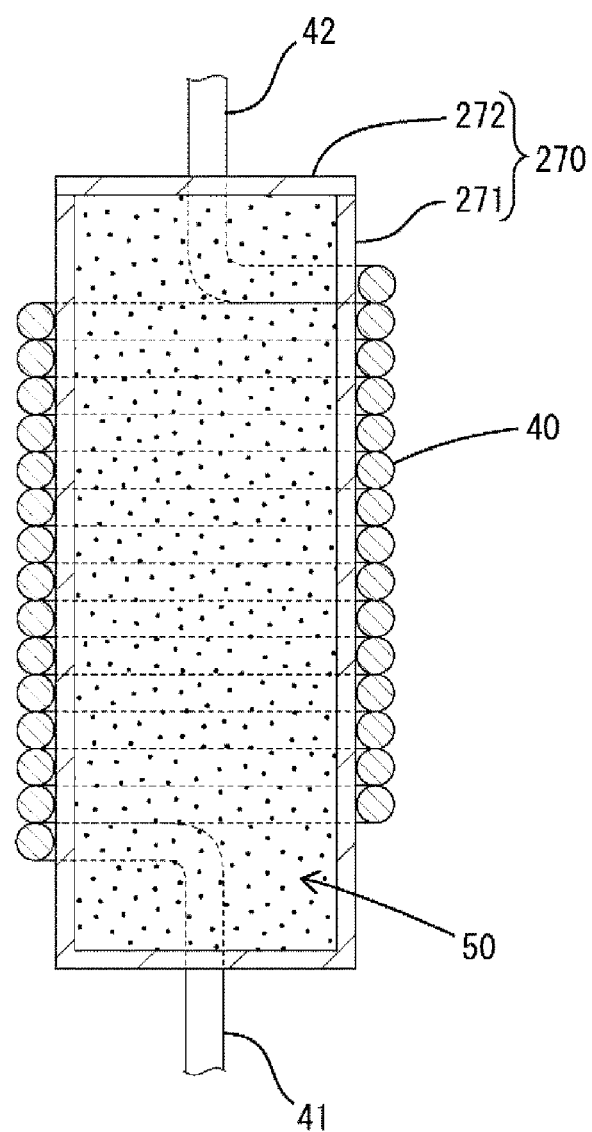
FIG. 2 is a plan view showing a portion of a noise filter according to Embodiment 2.

As shown in FIG. 2, a holding member 270 has a shape like a cylindrical container of which both ends are closed. The holding member 270 is constituted by an insulating material. The holding member 270 includes a front box portion 271 and a rear wall portion 272. The front box portion 271 has a box-like shape and the rear side of the front box portion 271 is open. The rear wall portion 272 is attached to the front box portion 271 to close the opening of the front box portion 271. The holding member 270 is fixed to the bottom surface (not shown) of the case 60. The holding member 270 is arranged inside the coil 40. Specifically, the coil 40 is formed from an uncoated metal wire, is wound around the outer periphery of the holding member 270, and is positioned with respect to the holding member 270. An outer peripheral surface of the holding member 270 is in contact with an inner peripheral surface of the coil 40. The one end 41 of the coil 40 extends to the front side of the holding member 270. The other end 42 of the coil 40 extends to the rear side of the holding member 270. The magnetic member 50 is constituted by a powder of a magnetic material and is housed in the holding member 270 to fill the inside of the holding member 270. Thus, the holding member 270 holds the magnetic member 50 in a state in which the magnetic member 50 is positioned with respect to the coil 40.

Similarly to the noise filter 10 according to Embodiment 1, the noise filter 10 configured as described above functions to remove noise generated in the harness side conduction path. Furthermore, the inductance of the coil 40 can be enhanced in the noise filter 10 as a result of the magnetic member 50 being arranged inside the coil 40 in a state in which the magnetic member 50 is positioned. Also, the magnetic member 50 is housed in the holding member 270 made of an insulating material, and therefore it is possible to prevent electrolytic corrosion that would be caused if the magnetic member 50 and the coil 40 are in direct contact with each other. As described above, as a result of the magnetic member 50 being contained in the holding member 270 that is arranged inside the coil 40, the noise removal performance can be enhanced in the noise filter 10 with a simple configuration without changing the external shape of the case 60 or the like.

Next, a process for attaching the coil 40 to the holding member 270 will be described.

Similarly to FIG. 1, the capacitor 30 is attached to the bottom surface of the case 60. Then, the one end 41 of the coil 40 wound around the outer periphery of the holding member 270 is soldered to the conductive plate 25. The holding member 270 is prepared in a state in which the opening of the front box portion 271 is not closed by the rear wall portion 272. Subsequently, the inside of the holding member 270 is filled with the magnetic member 50. Subsequently, the opening of the front box portion 271 is closed by the rear wall portion 272. Thereafter, similarly to Embodiment 1, the other end 42 of the coil 40 is connected to the left side electrode of the capacitor 30 (see FIG. 1). Note that the right side coil 40 is attached to the holding member 270 through a similar process.

In the noise filter 10 according to Embodiment 2, the holding member 270 has a container-like shape and is arranged inside the coil 40. The magnetic member 50 is housed in the holding member 270.

With this configuration, the inductance can be enhanced in the noise filter 10 as a result of the magnetic member 50 being arranged inside the coil 40.

Also, in the noise filter 10, the magnetic member 50 is housed in the holding member 270 made of an insulating material. Therefore, it is possible to prevent electrolytic corrosion that would be caused if the magnetic member 50 and the coil 40 are in direct contact with each other.

Embodiment 3

Figure 3:
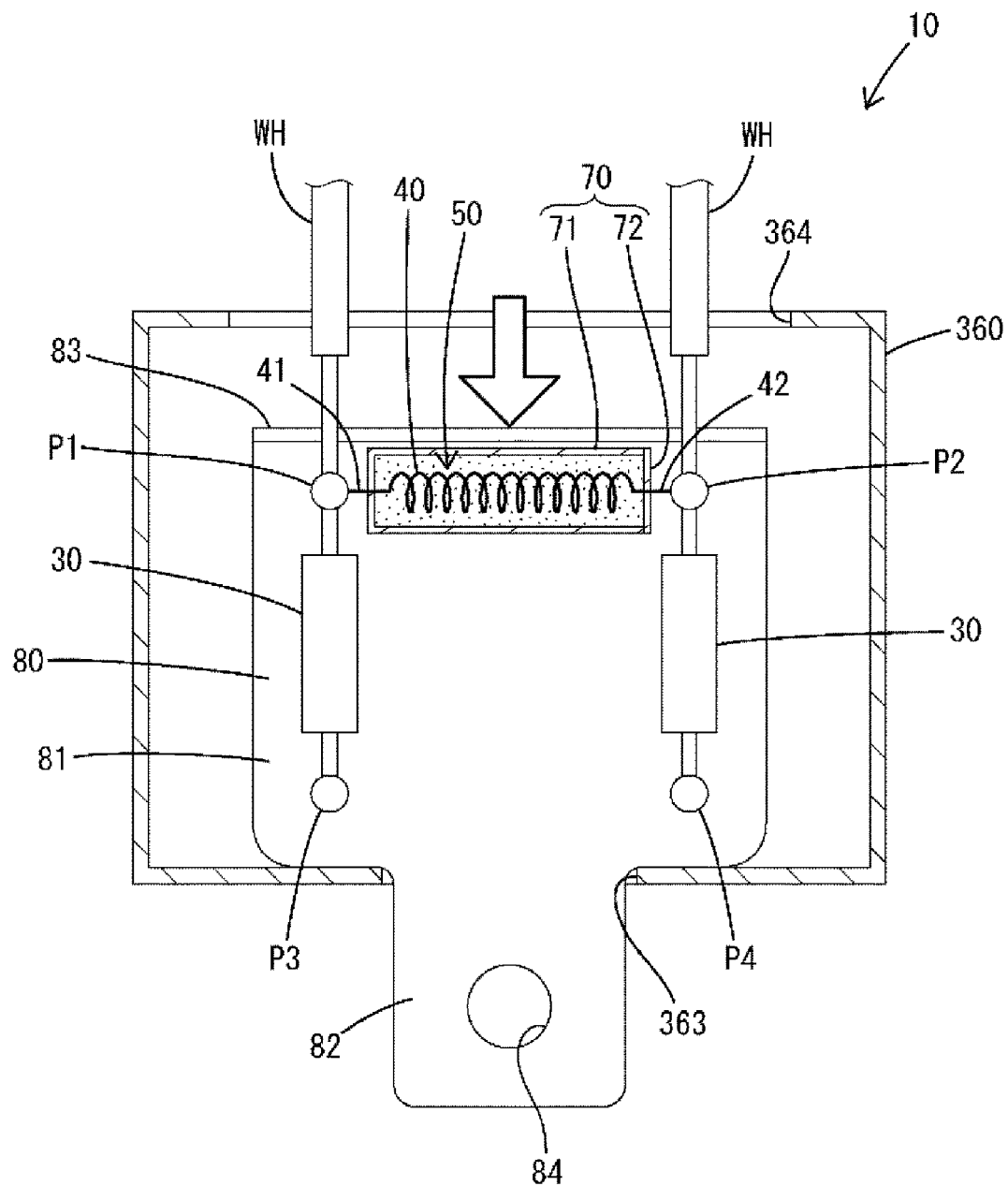
FIG. 3 is a plan view showing a portion of a noise filter according to Embodiment 3.

Next, Embodiment 3, which is a specific embodiment of the present invention, will be described with reference to FIG. 3. The noise filter 10 according to Embodiment 3 differs from the above-described Embodiment 1 in the configuration of the inside of the case. Other configurations are the same as those in the above-described Embodiment 1, and therefore the same configurations are denoted with the same reference numerals as those used in Embodiment 1, and descriptions of structures, functions, and effects thereof are omitted. In the following description, with regard to the front-rear direction, the lower side of FIG. 3 is defined as the front side and the upper side of FIG. 3 is defined as the rear side. With regard to the left-right direction, the left side and the right side are defined based on the left-right direction shown in FIG. 3. With regard to the up-down direction, the front side of FIG. 3 is defined as the upper side and the rear side of FIG. 3 is defined as the lower side.

As shown in FIG. 3, the noise filter 10 according to Embodiment 3 includes a connector (not shown), a pair of capacitors 30, the coil 40, the magnetic member 50, a case 360, the holding member 70, and an earth member 80. The case 360 has a box-like shape. Insertion holes 363 and 364 are formed in the case 360. The insertion hole 363 is formed as a slit that is elongated in the left-right direction at a center portion in the left-right direction in a front side wall portion of the case 360. The insertion hole 364 is formed as a hole that is larger than the insertion hole 363 at a center portion in the left-right direction in a rear side wall portion of the case 360.

The earth member 80 is a member that is electrically connected to the capacitors 30 and is used for grounding. The earth member 80 is formed by punching out and bending a conductive plate-like member that is made of a copper alloy or the like. As shown in FIG. 3, the earth member 80 includes an earth plate portion 81, an attachment portion 82, and a pressure receiving portion 83. The earth plate portion 81 has a flat plate-like shape that is quadrangular in a plan view. The earth plate portion 81 is arranged on a lower surface side of the case 360 and covers most of the lower surface of the case 360. The earth plate portion 81 supports the coil 40 and the capacitors 30. The attachment portion 82 protrudes forward from the case 360. The attachment portion 82 is inserted into the insertion hole 363 of the case 360 from behind. A perfect circular bolt hole 84 is formed at the center of the attachment portion 82. The noise filter 10 is fixed to a vehicle body panel (not shown) or the like using a bolt via the bolt hole 84. The pressure receiving portion 83 stands upward substantially at a right angle from a rear side edge portion of the earth plate portion 81. The earth member 80 is attached to the case 360 as a result of a pressing force being applied to the pressure receiving portion 83 from behind.

The pair of capacitors 30 and the coil 40 constitute a π filter circuit. The one end 41 of the coil 40 is connected to the input/output wire WH at a connection point P1. The other end 42 of the coil 40 is connected to the input/output wire WH at a connection point P2. On an upper surface of the earth plate portion 81, the holding member 70 is arranged adjacent to the pressure receiving portion 83 on the front side thereof. The magnetic member 50 is constituted by a powder of a magnetic material, and is contained in the holding member 70 similarly to Embodiment 1. The pair of capacitors 30 are of the same type and have the same capacity, for example. One electrode of the left side capacitor 30 is connected to the one end 41 of the coil 40 and the input/output wire WH at the connection point P1. Another electrode of the left side capacitor 30 is connected to the earth plate portion 81 at a connection point P3. One electrode of the right side capacitor 30 is connected to the other end 42 of the coil 40 and the input/output wire WH at the connection point P2. Another electrode of the right side capacitor 30 is connected to the earth plate portion 81 at a connection point P4.

Next, a process for attaching the earth member 80 to the case 360 will be described.

As shown in FIG. 3, the input/output wire WH, the capacitors 30, the coil 40, and the holding member 70 are attached to the earth member 80. Then, the earth member 80 is passed through the insertion hole 364 from the rear side of the case 360 to be attached to the inside of the case 360. At this time, the earth member 80 is inserted into the insertion hole 364 with the attachment portion 82 facing forward, and a forward pressing force is applied to the pressure receiving portion 83 from behind. That is, the worker presses the pressure receiving portion 83 from the side opposite to the coil 40 and the capacitors 30. Therefore, the worker need not touch the coil 40 and the capacitors 30, and accordingly, there is no risk that the coil 40 and the capacitors 30 will be damaged. The attachment portion 82 is inserted into the insertion hole 363 of the case 360. The earth member 80 is fixed in a state in which the earth plate portion 81 is in contact with the front side wall portion of the case 360, for example. Thus, the coil 40, the capacitors 30, and the earth member 80 can be attached to the case 360 through a single action of pressing the pressure receiving portion 83, and therefore workability is good.

As described above, the noise filter 10 according to Embodiment 3 includes the earth member 80 that is electrically connected to the capacitors 30 and is used for grounding. The earth member 80 includes the earth plate portion 81, the attachment portion 82, and the pressure receiving portion 83. The earth plate portion 81 has a flat plate-like shape and supports the coil 40 and the capacitors 30. The attachment portion 82 extends from the earth plate portion 81 and is attached to a grounding member to be grounded. The pressure receiving portion 83 stands on the earth plate portion 81 and receives a pressing force from the side opposite to the coil 40 and the capacitors 30. As a result of a pressing force being applied to the pressure receiving portion 83, the earth member 80 is attached to the case 360.

As described above, the coil 40, the capacitors 30, and the earth member 80 can be attached to the case 360 through a single action of pressing the pressure receiving portion 83, and therefore workability is good. Furthermore, there is no need to touch the coil 40 and the capacitors 30 when attaching the coil 40 and the capacitors 30 to the case 360, and accordingly, there is no risk that the coil 40 and the capacitors 30 will be damaged.

Embodiment 4

Next, Embodiment 4, which is a specific embodiment of the present invention, will be described with reference to FIG. 4. The noise filter 10 according to Embodiment 4 differs from the above-described Embodiment 1 in the configurations of the magnetic member and the holding member. Other configurations are the same as those in the above-described Embodiment 1, and therefore the same configurations are denoted with the same reference numerals as those used in Embodiment 1, and descriptions of structures, functions, and effects thereof are omitted. In the following description, with regard to the front-rear direction, the front side and the rear side are defined based on the front-rear direction shown in FIG. 4. With regard to the left-right direction, the left side and the right side are defined based on the left-right direction shown in FIG. 4. With regard to the up-down direction, the upper side and the lower side are defined based on the up-down direction shown in FIG. 4.

Figure 4:
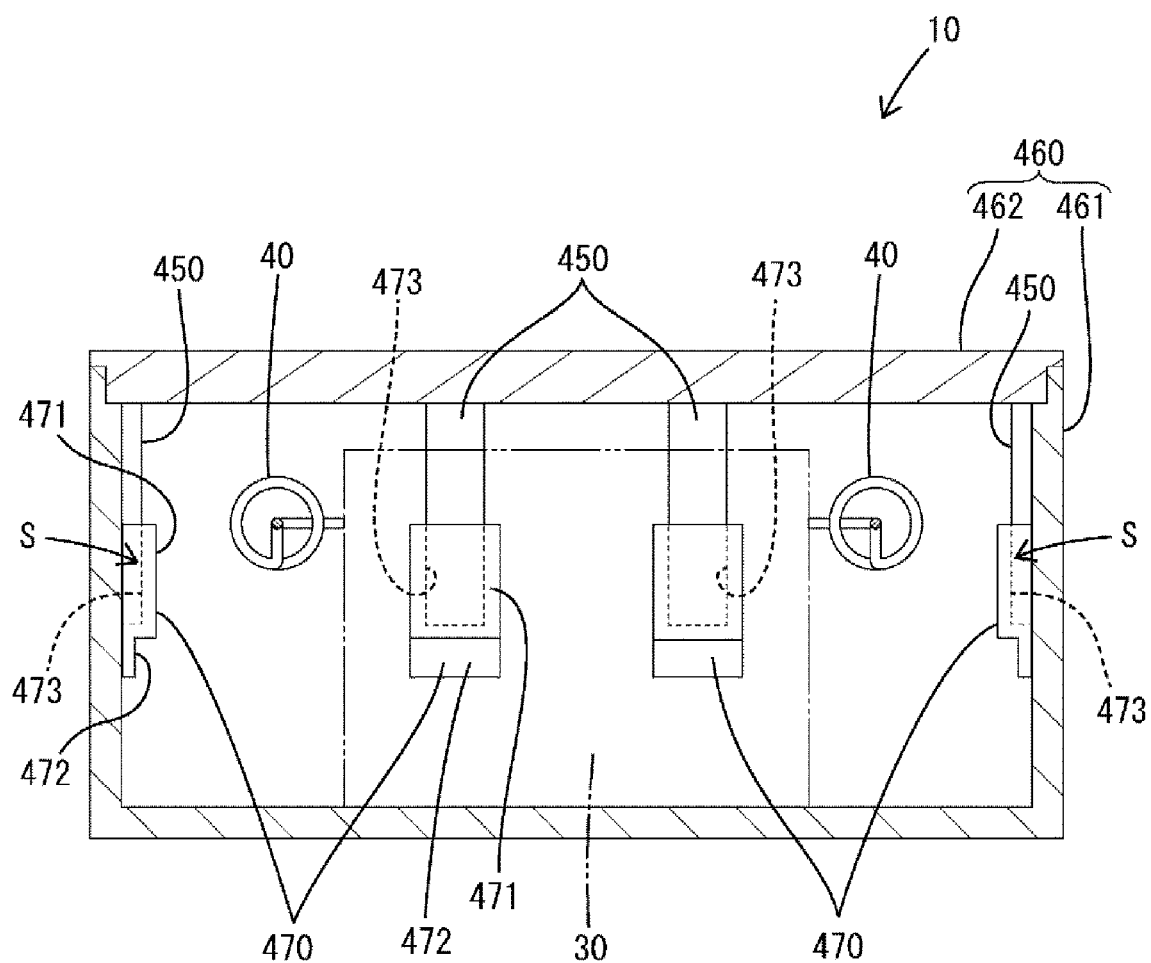
FIG. 4 is a cross-sectional side view showing a portion of a noise filter according to Embodiment 4.

As shown in FIG. 4, the noise filter 10 according to Embodiment 4 includes a connector (not shown), the capacitor 30, a pair of coils 40, magnetic members 450, and holding members 470. The connector, the capacitor 30, and the coils 40 have configurations similar to those in Embodiment 1. The capacitor 30 and the coils 40 are attached to a case 460 in a state of being positioned with respect to the case 460. The case 460 is made of a synthetic resin, for example. The case 460 includes a box portion 461 and a ceiling portion 462. The box portion 461 has a box-like shape and the upper side of the box portion 461 is open. The ceiling portion 462 has a plate-like shape and can close the upper side opening of the box portion 461. The ceiling portion 462 is pressed into the opening of the box portion 461. Similarly to Embodiment 1, a pair of insertion holes (not shown) through which the input/output wire WH can pass are formed in the case 460.

As shown in FIG. 4, the holding members 470 are fixed to inner surfaces of side walls of the case 460. Specifically, the plurality of holding members 470 are arranged around the coils 40 so as to surround the coils 40 and be spaced apart from each other. In FIG. 4, two holding members 470 are provided on each side wall of the case 460. The holding members 470 are provided at centers in the up-down direction of the side walls of the case 460 so as to be spaced apart from the ceiling portion 462. Each holding member 470 includes a housing portion 471 and a fixed portion 472. A rectangular recess 473 is formed in the housing portion 471. The fixed portion 472 is rectangular. The fixed portion 472 is a portion that is attached to an inner surface of the case 460. The recess 473 in the holding member 470 faces the inner surface of the case 460 with a space S therebetween. The holding member 470 is provided on the inner surface of the case 460 such that the recess 473 in the housing portion 471 is open upward.

As shown in FIG. 4, each magnetic member 450 has a thin plate-like shape. The magnetic member 450 is held in a state of being sandwiched between the holding member 470 and the inner surface of the case 460 as a result of being inserted into the space S from the upper side of the holding member 470. The magnetic member 450 held by the holding member 470 is positioned with respect to the coil 40 and the case 460. Since the holding member 470 is fixed to the inner surface of the side wall of the case 460, the magnetic member 450 can be arranged along the inner surface of the case 460. By inserting the magnetic member 450 into the space S, the magnetic member 450 can be easily attached to the case 460 in a state of being positioned. The shape of the holding member 470 can be simplified as a result of the inner surface of the case 460 being used. The plurality of magnetic members 450 are arranged around the coils 40 so as to surround the coils 40 and be spaced apart from each other. The magnetic members 450 are in contact with a lower surface of the ceiling portion 462 of the case 460 to be kept from falling off.

In the noise filter 10 configured as described above, the plurality of magnetic members 450 are arranged so as to surround the coils 40, and therefore magnetic fluxes generated from the coils 40 are likely to be suppressed and the inductance of the coils 40 is likely to be enhanced. Furthermore, since the plurality of magnetic members 450 are arranged around the coils 40 so as to be spaced apart from each other, the weight and the cost of the noise filter 10 can be reduced when compared to a configuration in which the magnetic members 450 are arranged around the entire peripheries of the coils 40.

As described above, in the noise filter 10 according to Embodiment 4, each magnetic member 450 has a thin plate-like shape. Each holding member 470 faces an inner surface of the case 460 with a space S therebetween. Each magnetic member 450 is held in a state of being sandwiched between the holding member 470 and the inner surface of the case 460 as a result of being inserted into the space S.

With this configuration, each magnetic member 450 can be easily attached to the case 460 in a state of being positioned, as a result of being inserted into the space S between the holding member 470 and the case 460. Since the inner surface of the case 460 is used as a means for positioning the magnetic member 450, the shape of the holding member 470 can be simplified when compared to a case in which the magnetic member 450 is positioned by using only the holding member 470.

Other Embodiments

The present invention is not limited to the embodiments described above with reference to the drawings, and for example, the following embodiments are also included in the technical scope of the present invention.

(1) In the above-described Embodiments 1 to 4, a film capacitor is used as the capacitor, but the capacitor may also be an electrolytic capacitor or a ceramic capacitor.

(2) In the above-described Embodiments 1 to 4, the number of poles of the terminal fitting is two, but the number of poles may also be three or more.

(3) In the above-described Embodiments 1 to 4, the capacitor and the coil are connected to each other through soldering, but laser welding, resistance welding, or the like may also be used.

(4) In the above-described Embodiment 3, the magnetic member 50 in the form of powder is contained in the holding member 270. However, the magnetic member 50 may also be a cylindrical solid.

(5) In the above-described Embodiment 4, the holding members 470 are separate from the case 460, but the holding members 470 and the case 460 may also be formed as a single body.

(6) In the above-described Embodiment 4, two holding members 470 are arranged on each side surface of the case 460, but the number of holding members 470 arranged on each side surface of the case 460 need not be limited to two.

LIST OF REFERENCE NUMERALS

10 Noise filter
20 Connector
22 Terminal fitting
30 Capacitor
40 Coil
50, 450 Magnetic member
60, 360, 460 Case
70, 270, 470 Holding member
80 Earth member
81 Earth plate portion
82 Attachment portion
83 Pressure receiving portion
S Space
WH Input/output wire (conducting wire)

What is claimed is:

1. A noise filter comprising:
a connector that houses a terminal fitting connected to a conducting wire in a state in which the conducting wire is lead out from the connector;
a coil that is connected to the conducting wire;
a capacitor that is electrically connected to the coil;
a magnetic member;
a case that houses the capacitor, the coil, and the magnetic member; and
a holding member that holds the magnetic member in a state in which the magnetic member is positioned with respect to the coil,
wherein the holding member has a container-like shape and is arranged inside the coil, and the magnetic member is housed in the holding member.

2. The noise filter according to claim 1, further comprising an earth member that is electrically connected to the capacitor and is used for grounding,
wherein the earth member includes:
a flat plate-shaped earth plate portion that supports the coil and the capacitor;
an attachment portion that extends from the earth plate portion and is attached to a grounding member to be grounded; and
a pressure receiving portion that stands on the earth plate portion and receives a pressing force from a side opposite to the coil and the capacitor, and
the earth member is attached to the case as a result of a pressing force being applied to the pressure receiving portion.

3. The noise filter according to claim 1,
wherein the holding member is made of an insulating material.

4. The noise filter according to claim 1,
wherein the holding member is made of a magnetic material, and
the magnetic member is held by the holding member so as to surround the coil and form a closed magnetic circuit around the coil.

5. The noise filter according to claim 4,
wherein a plurality of the magnetic members are arranged around the coil so as to surround the coil and be spaced apart from each other.

6. The noise filter according to claim 4,
wherein the holding member is fixed to an inner surface of the case.

7. The noise filter according to claim 6,
wherein the magnetic member has a thin plate-like shape,
the holding member faces the inner surface of the case with a space therebetween, and
the magnetic member is held in a state of being sandwiched between the holding member and the inner surface of the case as a result of being inserted into the space.

* * * * *